United States Patent [19]
Kishida et al.

[11] Patent Number: 5,568,289
[45] Date of Patent: Oct. 22, 1996

[54] LIQUID CRYSTAL DISPLAY DEVICE

[75] Inventors: Masahiro Kishida, Nabari; Toshiyuki Yoshimizu, Soraku-gun; Takeshi Seike, Kitakatsuragi-gun, all of Japan

[73] Assignee: Sharp Kabushiki Kaisha, Osaka, Japan

[21] Appl. No.: 404,087

[22] Filed: Mar. 14, 1995

[30] Foreign Application Priority Data

Mar. 18, 1994 [JP] Japan .................................... 6-049333

[51] Int. Cl.⁶ .............................. G09G 3/36; G02F 1/133
[52] U.S. Cl. ................................................. 359/58; 257/30
[58] Field of Search ................................. 359/58, 60, 79; 257/30

[56] References Cited

U.S. PATENT DOCUMENTS

| | | |
|---|---|---|
| 4,413,883 | 11/1983 | Baraff et al. . |
| 4,741,601 | 5/1988 | Saito ....................... 359/58 |
| 5,033,823 | 7/1991 | Shannon ................... 359/58 |
| 5,236,573 | 8/1993 | Shannon ................... 205/122 |

FOREIGN PATENT DOCUMENTS

| | | |
|---|---|---|
| 52-149090 | 12/1977 | Japan . |
| 57-192991 | 11/1982 | Japan . |
| 2-304534 | 12/1990 | Japan . |
| 3-52277 | 3/1991 | Japan . |
| 5-119353 | 5/1993 | Japan . |

*Primary Examiner*—William L. Sikes
*Assistant Examiner*—Kenneth Parker
*Attorney, Agent, or Firm*—Nixon & Vanderhye P.C.

[57] ABSTRACT

An LCD device includes a first substrate including a plurality of pixel electrodes arranged in a matrix, a plurality of signal wires formed of metal for supplying the plurality of pixel electrodes with an electric charge, and a plurality of two-terminal nonlinear devices for switching connection between the pixel electrodes and the signal wires into one of a conductive state and a non-conductive state; a second substrate located opposite to the first substrate and including a plurality of scanning electrodes arranged parallel to each other and crossing the signal wires; and a liquid crystal layer sandwiched between the first and the second substrates. Each two-terminal nonlinear device includes a lower electrode which is a part of the corresponding signal wire; a first insulator layer located on the lower electrode provided as a result of anodic oxidation of a part of the lower electrode and having a thickness of no greater than 1,000 angstroms; a second insulator layer covering the first insulator layer and having at least one opening, the second insulator layer being formed of a different material from the first insulator layer; and an upper electrode located on the second insulator layer and connected to the first insulator layer through the opening. Each signal wire has a top surface and a pair of side surfaces interposing the top surface. The upper electrode has an end extending diagonally with respect to the direction in which the corresponding signal wire extends on at least one of the side surfaces of the corresponding signal wire.

7 Claims, 18 Drawing Sheets

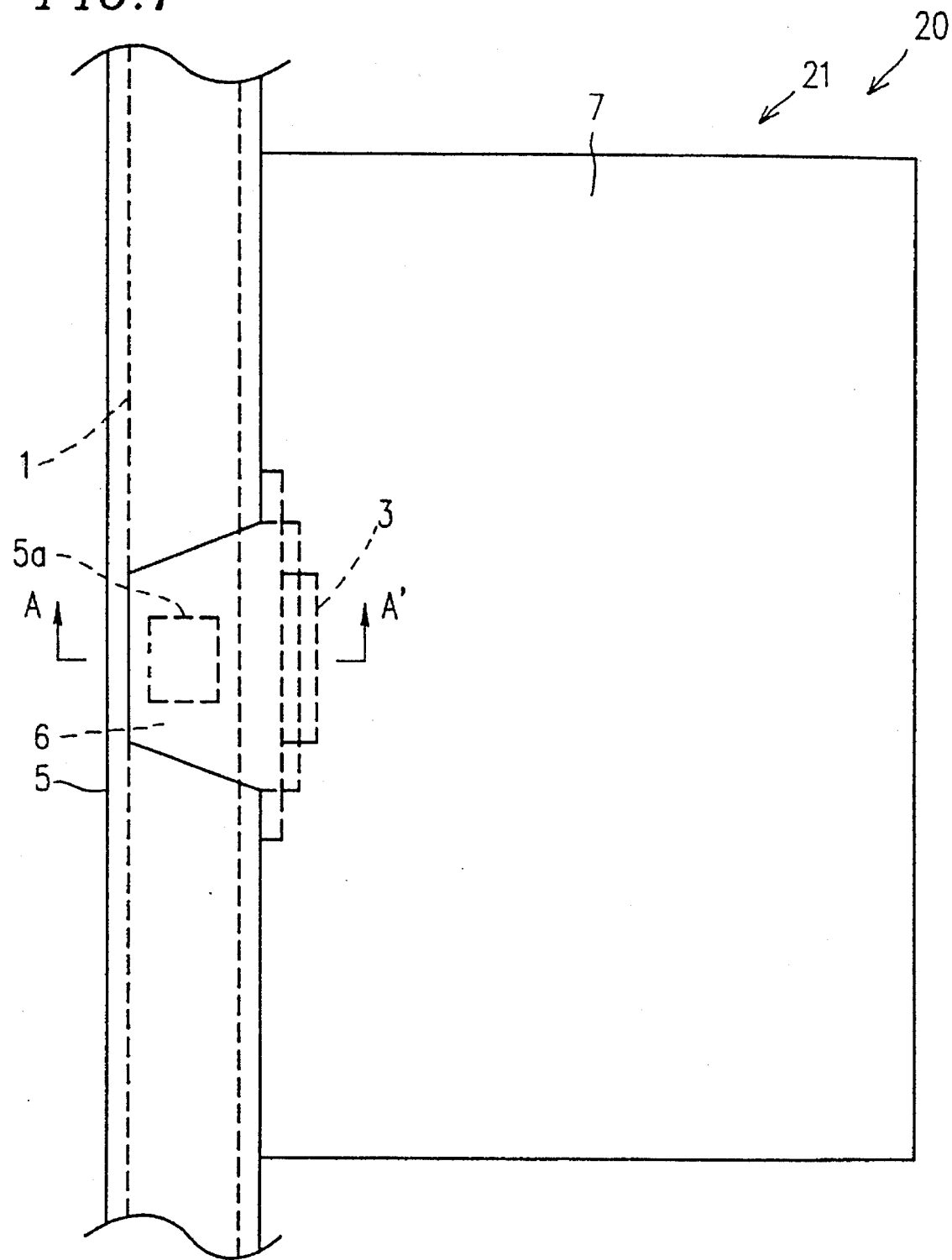

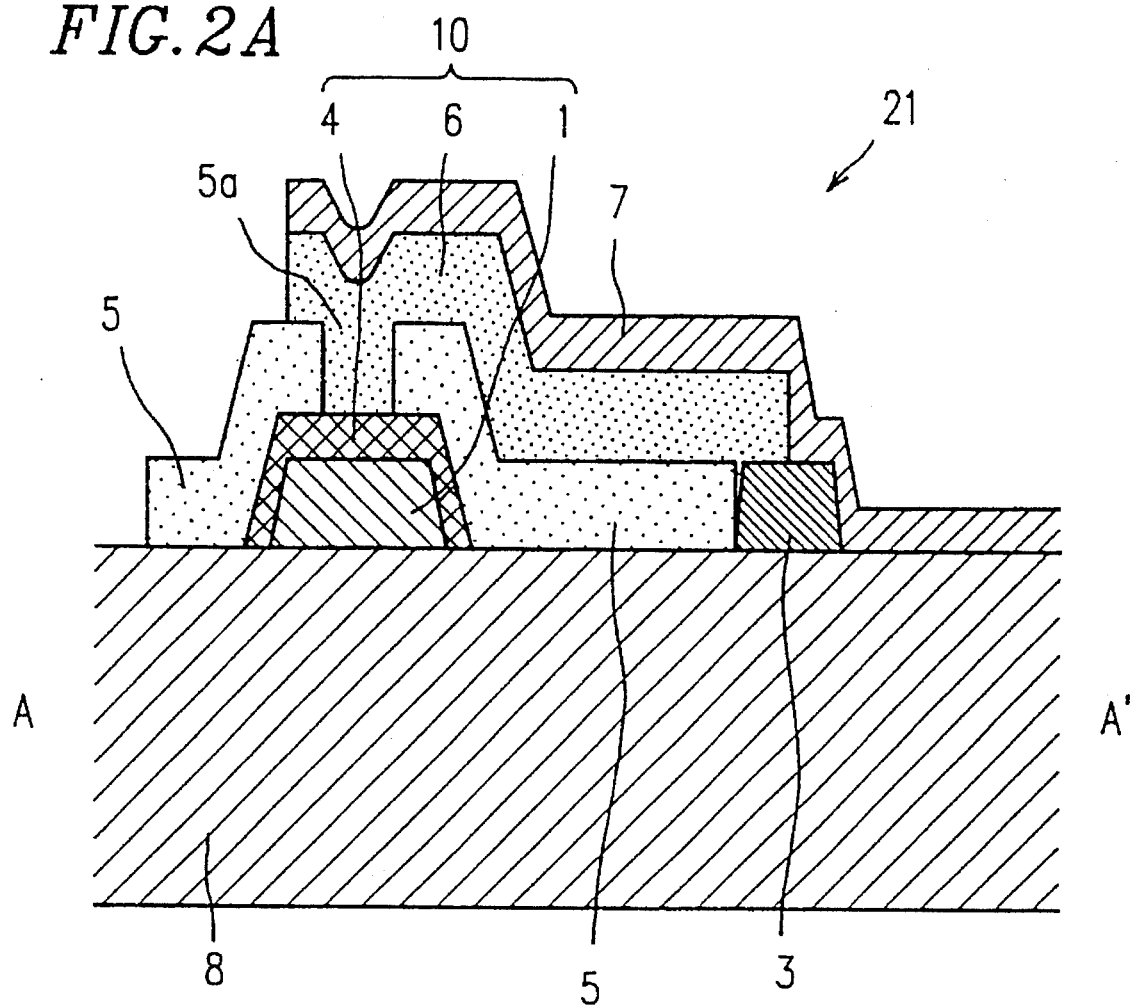

LIQUID CRYSTAL DISPLAY DEVICE

BACKGROUND OF THE INVENTION

1. Field of the Invention

The present invention relates to a liquid crystal display device (hereinafter, referred to as an "LCD device") having a metal-insulator-metal structure.

2. Description of the Related Art

Recently, LCD devices have been used in products in a variety of fields including office automation and audio visual equipment due to excellent display quality, thinness, lightness, low power consumption and the long life thereof. Especially, the display quality of LCDs is one of the highest among various display devices designed for man-machine interface, and is even higher than that of CRTs. Among various LCD devices, demands for active matrix LCD devices are increasing remarkably as LCD devices satisfying higher standards of display quality are necessitated by larger screens and higher resolution.

One type of active matrix LCD device uses a three-terminal device, for example, a thin film transistor as a switching device. Production of this type of active matrix LCD device is complicated and requires at least six to eight steps of thin film formation and photolithography, thus raising production costs. LCD devices using a two-terminal nonlinear device as a switching device, which can be produced at lower costs than the devices including a three-terminal switching device and still have higher display quality than that of passive matrix LCD devices, have been developing rapidly.

One of the known two-terminal nonlinear devices is a device having a metal-insulator-moral structure (hereinafter, referred to as an "MIM device"). As is well known, an LCD device includes a bottom substrate having a pixel electrode and an MIM device, a counter substrate, and a liquid crystal layer interposed therebetween. In an LCD device using an MIM device as a switching device, response of the liquid crystal molecules to the voltage applied to the liquid crystal layer is steep. Due to such a characteristic, images having a high contrast ratio can be displayed even in high duty driving necessitated by a larger screen and a higher resolution.

An MIM device includes, for example, a lower electrode, an upper electrode, and an insulator film interposed between the two electrodes as is described in Japanese Patent Publication No. 61-32573. An MIM device having such a structure uses a tantalum thin film as the lower electrode as is described in the U.S. Pat. No. 4,413,883. As is described in Japanese Patent Publication No. 61-32674, an insulator layer of $Ta_2O_5$ is formed by anodic oxidation Of the surface of the lower electrode. The upper electrode is formed of titanium, chrome, aluminum or the like on the insulator layer. In this manner, the MIM device is produced.

In such an MIM device, it is desirable that the current vs. voltage characteristic obtained when the current flows from the lower electrode to the upper electrode and the current vs. voltage characteristic obtained when the current flows from the upper electrode to the lower electrode should be symmetrical. Such a symmetrical current vs. voltage characteristic is obtained by forming the lower electrode and the upper electrode of an identical material with each other. However, if the two electrodes are formed of an identical material, the insulator layer and the lower electrode are possibly etched by a patterning process using photolithography for forming the upper electrode. Accordingly, if the two electrodes are formed of the same material, photolithography cannot be used to form the upper electrode. For these reasons, the upper electrode needs to be formed of a material which does not cause the insulator layer and the lower electrode to be etched by the patterning process for forming the upper electrode and still maintains the symmetrical current vs. voltage characteristic. For example, when tantalum is used for the lower electrode, titanium is used for the upper electrode.

FIG. 15 is a plan view of a part of an LCD device 100 including an MIM device 110. In detail, FIG. 15 shows a part of a bottom substrate 117 of the LCD device 100 corresponding to one pixel. FIG. 16 is a cross sectional view of the bottom substrate 117 shown in FIG. 15 taken along a line E–E' in FIG. 15. As is shown in FIGS. 15 and 16, the bottom substrate 117 includes a glass plate 108, a signal wire 101 formed of a tantalum film and located on the glass substrate 108, and a lower electrode 102 branched from the signal wire 101. An insulator layer 104 of $Ta_2O_5$ located on a lower electrode 102 is obtained by anodic oxidation of a surface of the lower electrode 102. The lower electrode 102 may be a part of the signal wire 101, instead of being an area branched therefrom. An upper electrode 106 is located on the insulator layer 104. The MIM device 110 includes the lower electrode 102, the upper electrode 106, and the insulation layer 104 interposed between the lower electrode 102 and the upper electrode 106. A pixel electrode 107 formed of a transparent conductive film such as an ITO (indium-tin-oxide) film is electrically connected to the upper electrode 106.

An island 103 shown in FIG. 15 is formed of the same material as the signal wire 101 and by the same process. In other words, the island 103 is formed by patterning the tantalum film used for the signal wire 101. The island 103 prevents the upper electrode 106 from peeling off from the glass plate 108 and provides better, ohmic contact of the upper electrode 106 with the pixel electrode 107.

In FIGS. 15 and 16, the MIM device 110 is located directly on the glass plate 108. Instead, a base coat insulator layer may be provided on the glass plate 108 before the signal wire 101, the lower electrode 102 and the island 103 are formed. In this way, contamination of the MIM device 110 by the glass plate 108 is avoided.

FIG. 17 is a cross sectional view of the LCD device 100 including the bottom substrate 117 shown in FIGS. 15 and 16 and a top (or counter) substrate 118. In detail, FIG. 17 shows a part of the LCD device 100 corresponding to one pixel. In FIG. 17, a base coat insulator layer 109a is provided on the glass plate 108.

The counter substrate includes a glass plate 111, a base coat insulator layer 109b provided on the glass plate 111, and a counter electrode 112 located on the base coat insulator layer 109b and arranged in strips perpendicular to the signal wire 101. The counter electrode 112 is formed of a transparent conductive film such as an ITO film.

A liquid crystal layer 114 is interposed between the bottom substrate 117 and the counter substrate 118. Both surfaces of the liquid crystal layer 114 are respectively covered with alignment films 113. An assembly including the two substrates 117 and 118 and the liquid crystal layer 114 is interposed between polarizing plates 115 (outside the bottom substrate 117) and 116 (outside the counter substrate 118) with air gaps therebetween.

The LCD device 100 is produced in the following manner.

The base coat insulator layer 109a is formed on the glass plate 108, and a tantalum thin film which contains nitrogen doped thereinto and includes an α phase structure and a β phase structure mixed together is deposited on the base coat insulator layer 109a by sputtering or the like at a thickness of 3,300 angstroms. The tantalum thin film is patterned as is prescribed by photolithography, thereby forming the signal wire 101, the lower electrode 102, and the island 103.

A surface of the lower electrode 102 is anodized to form the insulator layer 104 of $Ta_2O_5$ having a thickness of 600 angstroms.

Titanium is deposited on the entire surface of the resultant lamination by sputtering or the like at a thickness of 4,000 angstroms and patterned as is prescribed by photolithography, thereby forming the upper electrode 106. In this manner, the MIM device 110 is produced.

ITO is deposited at a thickness of 1,000 angstroms and patterned, thereby forming the pixel electrode 107. In this way, production of the bottom substrate 117 is completed.

The counter substrate 118 is produced by forming the base coat insulator layer 109b on the glass plate 111, depositing an ITO film on the base coat insulator layer 109b at a thickness of 3,500 angstroms and patterning the ITO film as is prescribed to form the counter electrode 112 in strips.

The two substrates 117 and 118 are then each covered with the alignment films 113 for aligning liquid crystal molecules which will be interposed therebetween. The alignment films 113 are then rubbed. The alignment films 113 are formed of a polyimide organic polymer. A sealing material is applied to one of the substrates 117 and 118, and spacers are scattered on the other substrate. The two substrates 117 and 118 are assembled together and fixed to each other by heat and pressure.

A liquid crystal material including the liquid crystal molecules is injected between the two substrates 117 and 118 to form the liquid crystal layer 114 and sealed. Then, the polarizing plates 115 and 116 are provided outside the two substrates 117 and 118, respectively.

Various structures have been proposed for an MIM device used as a switching device in LCD devices. For example, Japanese Laid-Open Patent Publication No. 3-52277 discloses an MIM device in which side surfaces of the insulator layer obtained by anodizing the surface of the lower electrode are covered with another insulator layer. Japanese Laid-Open Patent Publication No. 2-304534 describes an MIM device in which the upper electrode and the insulator layer on the lower electrode are connected to each other through a hole formed in an inter-layer insulator layer formed on the insulator layer. Japanese Laid-Open Patent Publication No. 5-119353 discloses a structure in which a thick $Ta_2O_5$ layer is formed at a shoulder of the signal wire by anodic oxidation or wet oxidation and a thin $Ta_2O_5$ layer used for a current path is formed in the remaining area by anodic oxidation or dry oxidation. Such a plurality of $Ta_2O_5$ layers used as upper electrodes each have a smaller width than that of the normal single signal upper electrode. In this structure, a plurality of MIM devices are provided for one pixel.

In the conventional LCD device 100 shown in FIGS. 15 through 17, the MIM device 110 is provided on the signal wire 101 or the lower electrode 102 branched therefrom. In such an MIM device 110, the current leak is excessively large from the side surfaces of the signal wire 101 and the lower electrode 102, and thus the withstand voltage is not sufficiently high. Accordingly, in production of such a conventional LCD device 100, rubbing of the alignment films 113 using a cloth generates static electricity, as a result of which, an excessive voltage is applied to the MIM device 110. In such a situation, insulation breakdown easily occurs. Even if insulation breakdown does not occur, static electricity possibly deteriorates the characteristics of the MIM device 110. Thus, defective MIM devices are produced by the influence of static electricity, lowering the production yield.

Further, an area of the upper electrode corresponding to the side surfaces of the lower electrode is easily exposed to stress and thus can easily be broken. As a result, the resulting MIM devices are defective, lowering the production yield.

SUMMARY OF THE INVENTION

An LCD device according to the present invention includes a first substrate including a plurality of pixel electrodes arranged in a matrix, a plurality of signal wires formed of metal for supplying the plurality of pixel electrodes with an electric charge, and a plurality of two-terminal nonlinear devices for switching connection between the plurality of pixel electrodes and the plurality of signal wires into one of a conductive state and a nonconductive state; a second substrate located opposite to the first substrate and including a plurality of scanning electrodes arranged parallel to each other and crossing the plurality of signal wires; and a liquid crystal layer interposed between the first substrate and the second substrate. The plurality of two-terminal nonlinear devices each include a lower electrode which is a part of the corresponding signal wire; a first insulator layer located on the lower electrode provided as a result of anodic oxidation of a part of the lower electrode and having a thickness of no greater than 1,000 angstroms; a second insulator layer covering the first insulator layer and having at least one opening, the second insulator layer being formed of a different material from the first insulator layer; and an upper electrode located on the second insulator layer and connected to the first insulator layer through the opening. The plurality of signal wires each have a top surface and a pair of side surfaces interposing the top surface. The upper electrode has an end extending diagonally with respect to a direction in which the corresponding signal wire extends on at least one of the side surfaces of the corresponding signal wire.

In one embodiment of the invention, the second insulator layer has a thickness exceeding 1,000 angstroms.

In one embodiment of the invention, one opening is provided for each pixel electrode at a top surface of the corresponding signal wire and has a width which is substantially equal to the width of the top surface.

In one embodiment of the invention, the first substrate includes a glass plate containing alkali metal, the plurality of signal wires are located directly on the glass plate, and the plurality of pixel electrodes are located on the second insulator layer used as a base coat insulator layer.

In one embodiment of the invention, the LCD device further includes an island located in the vicinity of each of the plurality of two-terminal nonlinear devices, the island being formed of an identical material with the plurality of signal wires, and each of the upper electrodes and each of the pixel electrodes respectively connected to the two-terminal nonlinear devices are partially superposed on the corresponding island.

In one embodiment of the invention, the plurality of pixel electrodes respectively connected to the two-terminal nonlinear devices are each superposed on an area of the corresponding upper electrode which is above the corresponding lower electrode.

According to another aspect of the invention, an active matrix substrate includes a pixel electrode; a signal wire formed of moral for supplying the pixel electrode with an electric charge, the signal wire including a top surface and a pair of side surfaces interposing the top surface; and a two-terminal nonlinear device for electrically connecting the signal wire and the pixel electrode. The two-terminal nonlinear device includes a lower electrode which is a part of the signal wire; a first insulator layer located on the lower electrode; a second insulator layer located on the first insulator layer and having an opening; and an upper electrode located on the second insulator layer and connected with the first insulator layer through the opening. The upper electrode has an end extending diagonally with respect to a direction in which the signal wire extends on at least one of the side surfaces of the signal wire.

Thus, the invention described herein makes possible the advantage of providing an LCD device including a two-terminal nonlinear device which has more constant characteristics and less defects and can be obtained at a higher yield by production of larger areas of LCD.

This and other advantage of the present invention will become apparent to those skilled in the art upon reading and understanding the following detailed description with reference to the accompanying figures.

BRIEF DESCRIPTION OF THE DRAWINGS

FIG. 1 is a plan view of a bottom substrate of an LCD device in an example according to the present invention;

FIG. 2A is a cross sectional view of the substrate shown in FIG. 1 taken along a line A–A' in FIG. 1;

DESCRIPTION OF THE PREFERRED EMBODIMENTS

Figure 2B:
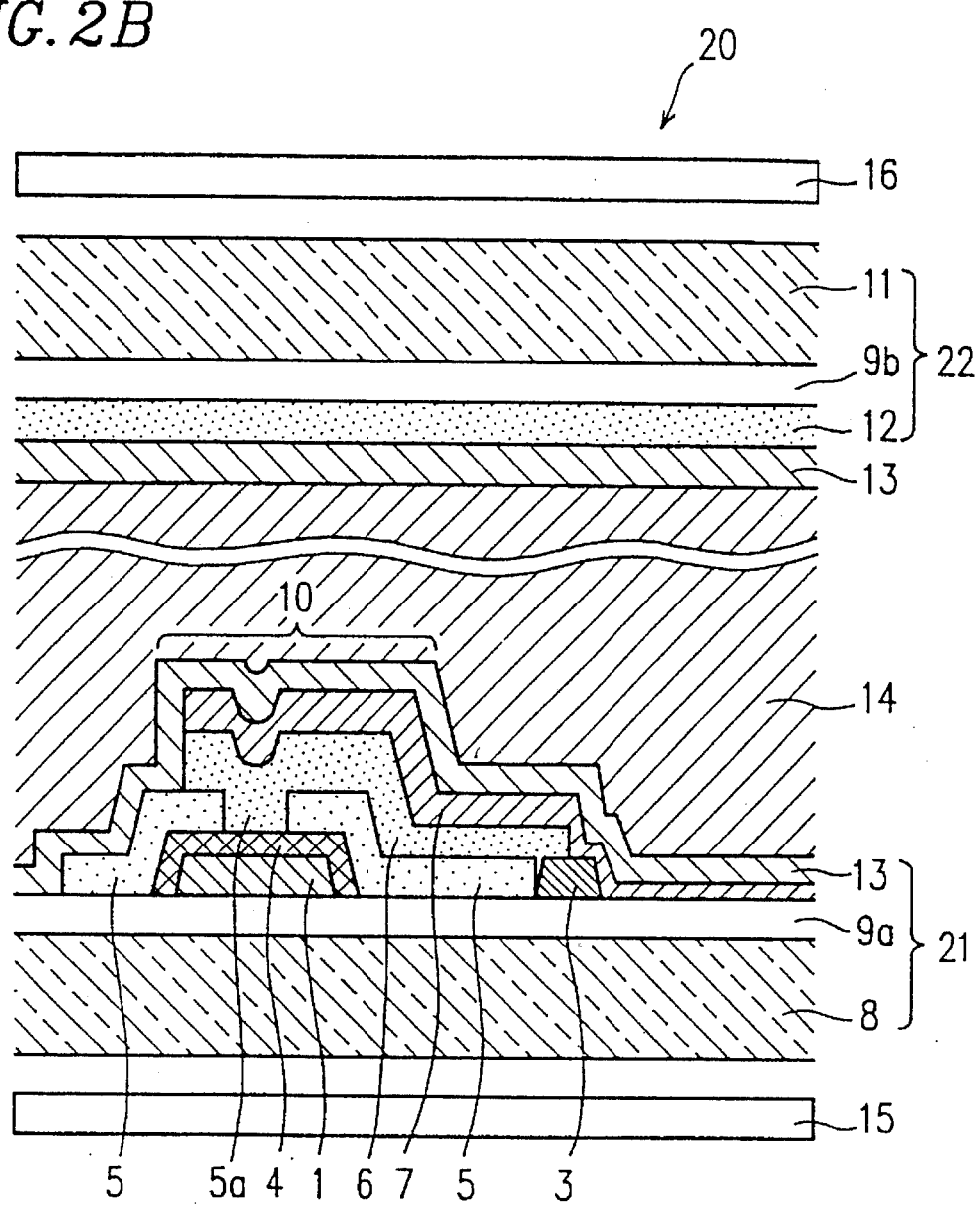
FIG. 2B is a cross sectional view of the LCD device in the example according to the present invention.

Hereinafter, the present invention will be described by way of illustrative example with reference to the accompanying drawings.

FIG. 1 is a plan view of a part of an LCD device 20 having an MIM device 10 in an example according to the present invention. In detail, FIG. 1 shows a part of a bottom substrate 21 of the LCD device 20 corresponding to one pixel. FIG. 2A is a cross sectional view of the bottom substrate 21 of the LCD device 20 shown in FIG. 1 taken along a line A–A' in FIG. 1.

As is illustrated in FIGS. 1 and 2A, the substrate includes a transparent glass plate 8, a base coat insulator layer (not shown) located on the glass plate 8, and a plurality of signal wires 1 (only one is shown) located on the base coat insulator layer. For simplicity, the following description will be regarding a part of the LCD device 20 corresponding to one pixel. The signal wire 1 is covered with an oxide film 4 (or first insulator layer) formed by anodic oxidation of a surface of the signal wire 1. An insulator layer 5 (or second insulator layer) is located on the oxide film 4 and the vicinity thereof. The insulator layer 5 has an opening 5a in an area corresponding to substantially in the middle of a top surface of the signal wire 1. An upper electrode 6 having a trapezoidal planar shape is located on the insulator layer 5. The upper electrode 6 is in contact with the oxide film 4 through the opening 5a. An MIM device 10 includes a part of the signal wire 1, a part of the oxide film 4, and a part of the upper electrode 6 corresponding to the opening 5a.

A pixel electrode 7 is disposed so as to overlap the entire surface of the upper electrode 6. An island 3 for realizing ohmic contact of the upper electrode 5 with the pixel electrode 7 is located on the base coat layer in the vicinity of the signal wire 1 and in direct contact with the pixel electrode 7. In the entire LCD device 20, a plurality of such pixel electrodes are arranged in a matrix.

FIG. 2B is a cross sectional view of the LCD device 20 including the bottom substrate 21 and a top (or counter) substrate 22. In FIG. 2B, the base coat insulator layer is included and represented by reference numeral 9a. The LCD device 20 includes the bottom substrate 21, the counter substrate 22, and a liquid crystal layer 14 interposed therebetween.

As is shown in FIG. 2B, the counter substrate 22 includes a transparent, glass plate 11, a base coat insulator layer 9b located on the glass plate 11, and a counter electrode 12 located on the base coat insulator layer 9b and arranged in strips perpendicular to the signal wire 1. The counter electrode 12 acts as a scanning electrode.

The LCD device 20 in this example is a reflective monochrome display device including a liquid crystal material in a twisted nematic mode. The number of pixels are 640×400 dots, and the pixel pitch is 0.36 mm. The width of the signal wire 1 is 20 µm, and the size of the opening 5a corresponding to the size of the MIM device 10 is 5 µm×6 µm. The ratio of the capacitance of the MIM device 10 to the capacitance of the liquid crystal layer 14 is approximately 1:10.

The substrate having the MIM device 10 is produced, for example, in the following manner.

First, on the glass plate 8, the base coat insulator layer 9a is formed of $Ta_2O_5$ or the like. The glass plate 8 is formed of, for example, quartz glass, borosilicate glass, or soda lime. In this example, Fusion Pyrex Glass No. 7059 (product number) produced by Corning, Inc. is used as the glass plate 8, and the base coat insulator layer is formed at a thickness of approximately 3,000 angstroms. Although the base coat insulator layer can be omitted, such a layer prevents the thin films and the liquid crystal layer 14 which will be formed thereon from being contaminated by impurities such as alkali metal ions, for example, sodium in the glass plate 8, and thus contributes to better characteristics of the resulting LCD device 20.

Next, a tantalum thin film is formed on the entire surface of the base coat insulator layer by DC sputtering at a thickness of 3,000 angstroms. A sintered TaN body containing nitrogen at a ratio of 5 mol % is used as a sputtering target, and argon gas is used as sputtering gas. The gas flow rate is 200 SCCM, the gas sputtering pressure is 0.4 Pa, the DC power is 5.3 W/cm$^2$. The glass plate 8 is transported at a rate of 100 mm/min. while heated at a temperature of 100° C. for three minutes. The distance between the glass plate 8 and the target is 77 mm.

The tantalum thin film is patterned by photolithography, thereby forming the signal wire 1, the island 3, and other wires for connecting a terminal of the LCD device 20 and an external driving circuit.

A surface of the signal wire 1 is anodized except for an area used as the terminal connected to the external driving circuit, thereby forming an oxide film 4 of $Ta_2O_5$ having a thickness of approximately 600 angstroms. The anodic oxidation is performed using a 1% solution of ammonium tartrate as an electrolyte at a temperature of the electrolyte of approximately 25° C., a voltage of 31 V, and a current of approximately 0.7 mA.

A film of silicon nitride is formed on the entire surface of the resultant lamination or on the signal wire 1 and the vicinity thereof by PCVD (plasma CVD) or the like at a thickness of 3,000 angstroms, The film is patterned by photolithography, thereby forming the insulator layer 5 having the opening 8a. The size of the opening 5a is 5 µm×6 µm. The insulator layer 5 may be formed of other materials instead of silicon nitride.

A metal thin film is formed on the insulator layer 5 by sputtering and patterned by photolithography or the like, thereby forming the upper electrode 6 having a trapezoidal planar shape as is shown in FIG. 1. The upper electrode 6 is formed of titanium.

In this manner, the MIM device 10 including the signal wire 1 acting as a lower electrode, the upper electrode 6, and the oxide film 4 interposed between the signal wire 1 and the upper electrode 6 is provided at an area corresponding to the opening 5a. Hereinafter, the signal wire 1 will also be referred to as the "lower electrode 1". The size of the MIM device 10 is 5 µm× 6 µm as is described above. Due to such a structure where the MIM device 10 is formed in an area corresponding to the opening 5a of the insulator layer 5, even if at least one end of the upper electrode 6 is diagonal with respect to the direction in which the signal wire 1 extends, instead of perpendicular thereto, the size of the MIM device 10 is not influenced by the shape of the upper electrode 6. Further, since the upper electrode 6 is out of contact with the base plate insulator layer 9a or the glass plate 8 between the signal wires 1, the transmissivity of the LCD device 20 is not lowered by the upper electrode 6 and thus the aperture ratio is increased.

After formation of the MIM device 10, a transparent conductive film such as an ITO film is deposited on the entire surface of the resultant lamination and patterned, thereby forming the pixel electrode 7. In this manner, the bottom substrate 21 is completed.

The counter substrate 22 is formed in the following manner. First, the base coat insulator layer 9b is formed on the glass plate 11. A transparent conductive film is formed on the entire surface thereof at a thickness of 3,500 angstroms and patterned, thereby forming the counter electrode 12 arranged in strips perpendicular to the signal wire 1 at a pitch of 0.36 mm. If a color filter is also provided on the counter substrate 22, the resultant LCD device 20 can display color images.

The surface of the bottom substrate 21 and a surface of the counter substrate 22 are each covered with an alignment film 13 at a sintering temperature of approximately 200° C. Then, the alignment films 13 are rubbed.

A thermosetting sealing material is applied to one of the substrates 21 and 22, and spacers are scattered on the other substrate. The two substrates 21 and 22 are assembled together and fixed to each other by heat of approximately 150° to 200° C. and pressure. The two substrates 21 and 22 are assembled so that liquid crystal molecules of the liquid crystal layer 14 will be twisted at 90 degrees when injected between the two substrates 21 and 22. Then, a liquid crystal material is injected between the two substrates 21 and 22 and sealed, thereby forming the liquid crystal layer 14. In this manner, a liquid crystal cell is produced.

A polarizing plate 15 having a transmissivity of 44.5% and a polarizing degree of 96.5% is provided outside the bottom substrate 21. A polarizing plate 16 including a polarizing plate having the same characteristics of the polarizing plate 15 and an aluminum reflective plate is provided outside the counter substrate 22, thereby producing the LCD device 20 having the electrooptical characteristics.

Figure 2C:
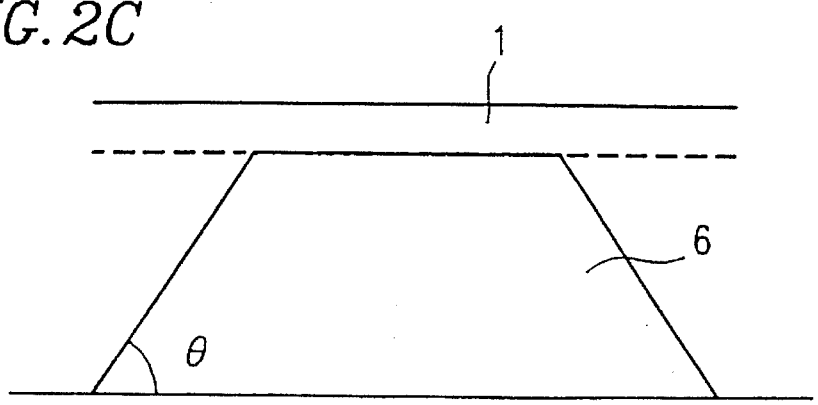
FIG. 2C is a view describing the angle between the direction in which a signal wire of the LCD device extends and ends of the upper electrode.
Figure 15:
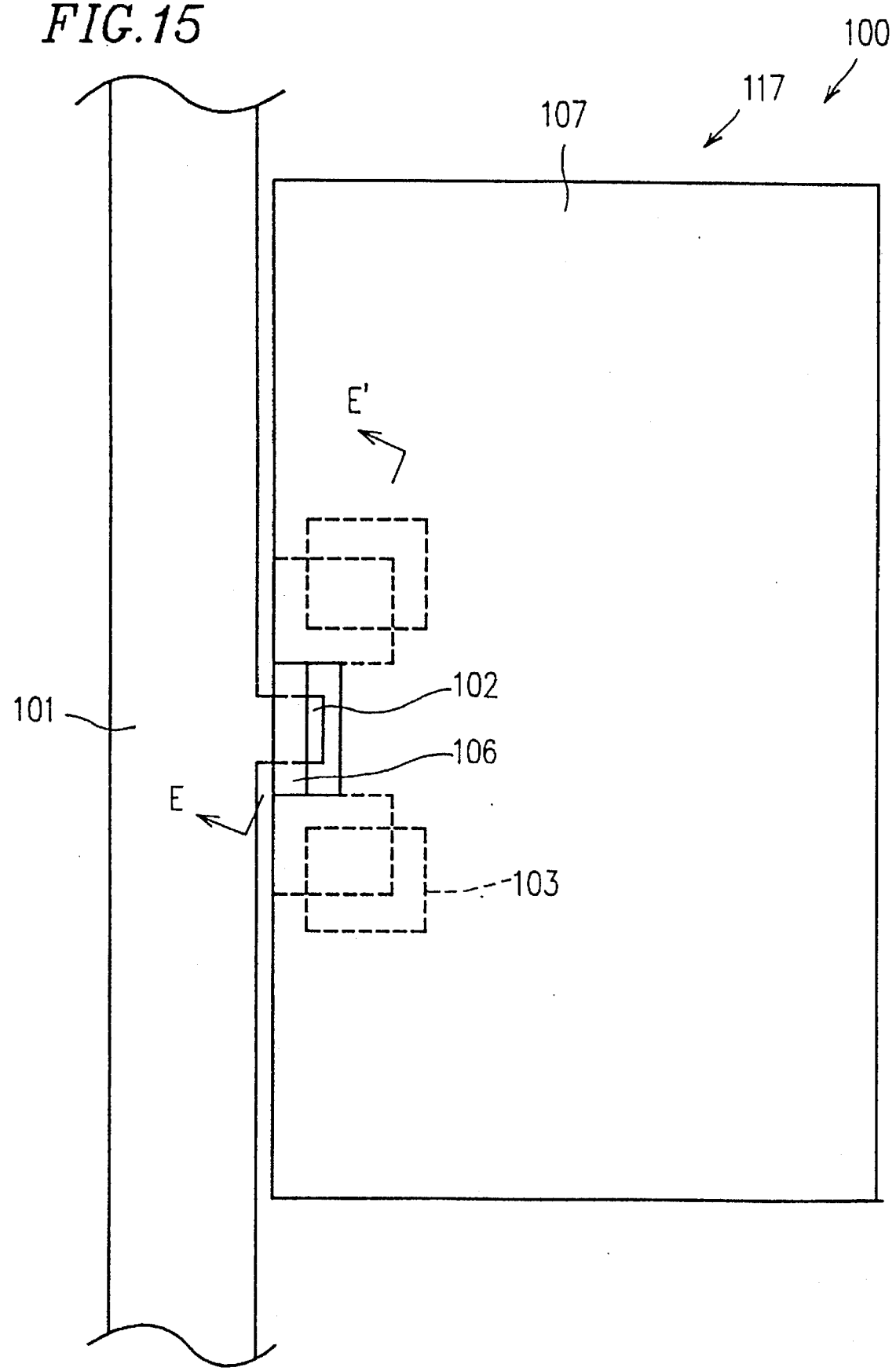
FIG. 15 is a plan view of a bottom substrate of a conventional LCD device.
Figure 16:
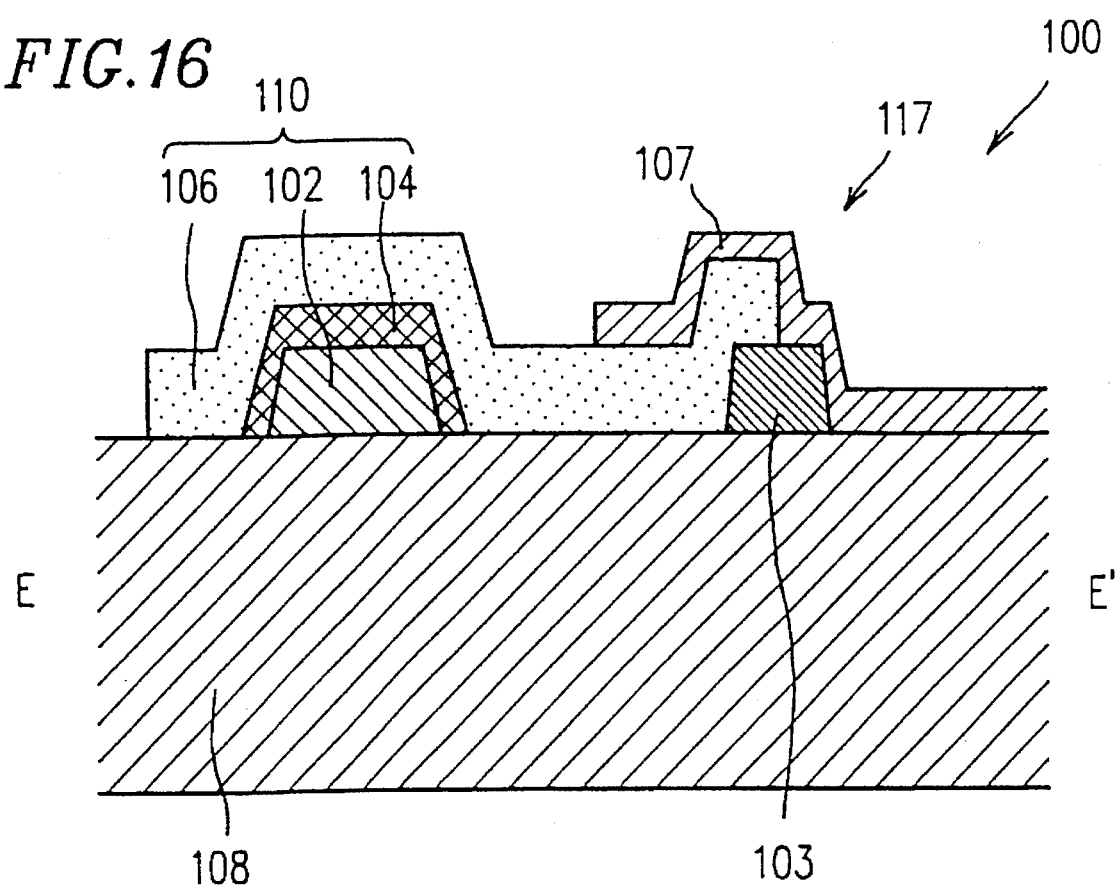
FIG. 16 is a cross sectional view of the bottom substrate shown in FIG. 15 taken along a line E–E' in FIG. 15.
Figure 17:
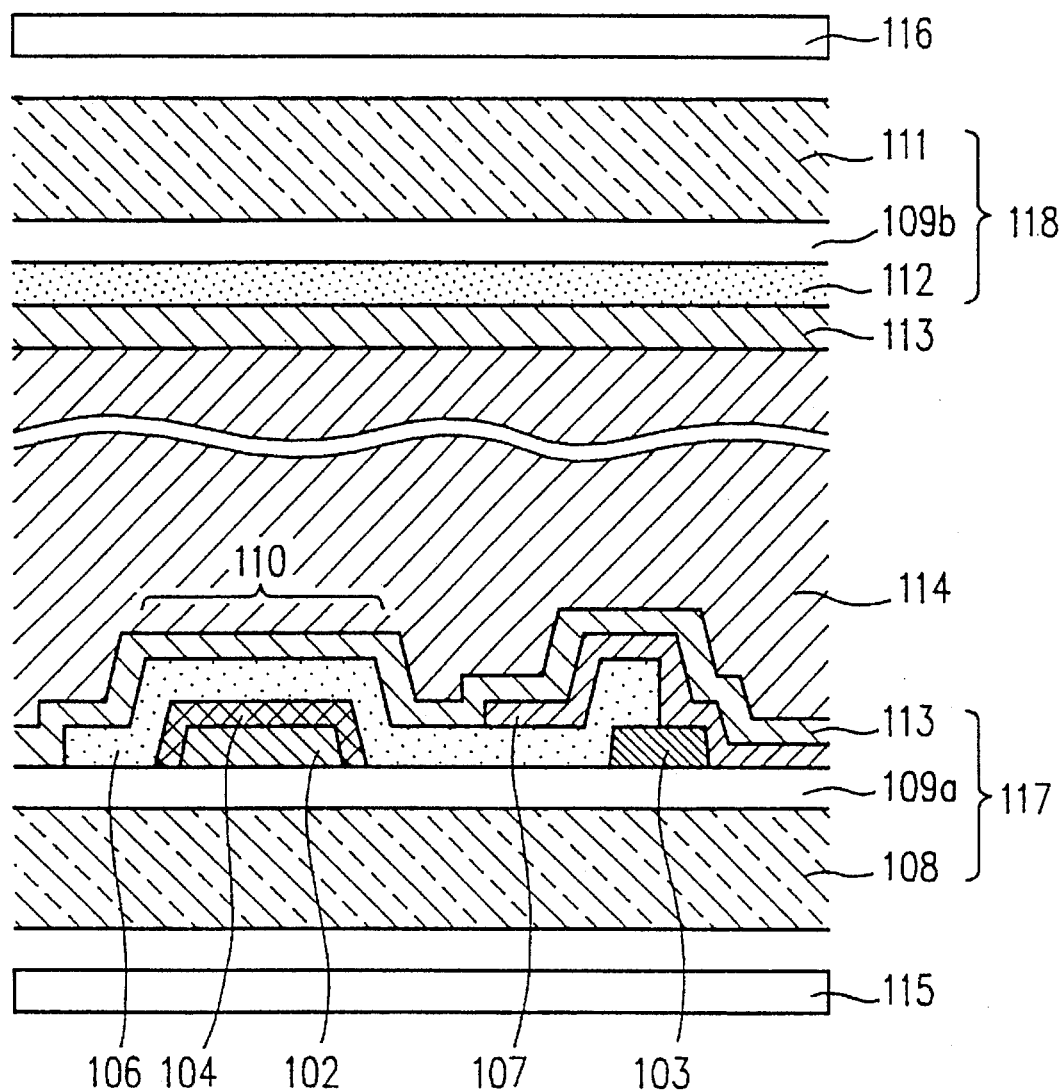
FIG. 17 is a cross sectional view of the conventional LCD device shown in FIG. 15.

In the LCD device 20, the signal wire 1 is used as the lower electrode of the MIM device 10. Due to such a structure, the aperture ratio is higher by several percent than in the LCD device 100 shown in FIGS. 15 through 17 where the lower electrode 102 of the MIM device 110 is separately provided from the signal wire 101. Because of the trapezoidal planar shape of the upper electrode 6, ends of the upper electrode 6 cross a side surface of the lower electrode 1 diagonally and thus slowly, instead of perpendicularly. In other words, the angle between the direction in which the signal wire 1 extends and each end of the upper electrode 6 (angle θ in FIG. 2C) is smaller than 90 degrees. Accordingly, the upper electrode 6 is more difficult to be cut by the physical force generated during the various processes after the MIM device 10 is formed than the case where the ends cross the side surface perpendicularly. As a result, production of defective MIM devices is restricted, thus restricting defective pixels. Accordingly, reduction in production yield is prevented. Preferably, the upper electrode 6 is formed so that angle θ in FIG. 2C is as small as possible.

In the LCD device 20, the oxide film 4 is covered with the insulator layer 5 on the side surfaces of the lower electrode 1. Accordingly, the withstand voltage of the MIM device 10 is increased, and thus the number of defective MIM devices 10 is significantly reduced. Since the insulator layer 5 is formed only on the signal wire 1 and the vicinity thereof, the transmissivity of the pixel area is not much lowered. The ohmic contact between the upper electrode 6 and the pixel electrode 7 through the island 3 realizes a more secure, satisfactory connection.

Figure 3:
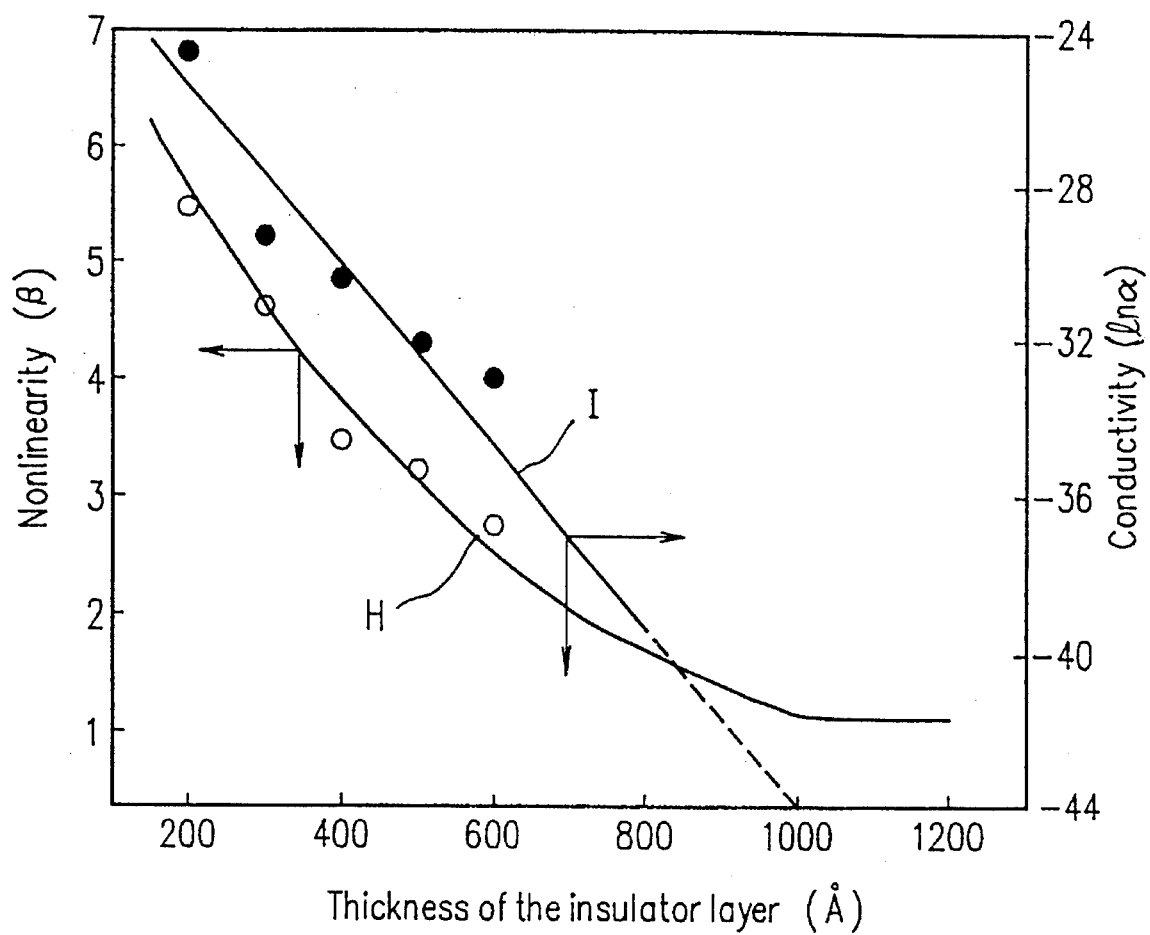
FIG. 3 is a graph illustrating the nonlinearity and the electric conductivity in accordance with the thickness of an insulator film of the MIM device included in the LCD device in the example according to the present invention.

FIG. 3 is a graph illustrating the nonlinearity (β) and the electric conductivity (lnα) in accordance with the thickness of the oxide film 4 of the MIM device 10. Line H represents the nonlinearity by a function of the thickness, line I represents the conductivity as a function of the thickness. As is appreciated from FIG. 3, when the thickness of the oxide film 4 exceeds 1,000 angstroms, the conductivity lowers significantly and thus the oxide film 4 can act as an insulator film of the LCD device 20. When the thickness is 1,000 angstroms or less, the nonlinearity which is sufficiently high for practical use is obtained and thus the oxide film 4 can act as an insulator film of the MIM device 10. In this example, the oxide film 4 is formed to have a thickness of 600 angstroms so that the nonlinearity and the conductivity are both satisfactory for practical use. In the area other than the opening 5a, the oxide film 4 having a thickness of 600 angstroms and the insulator layer 5 having a thickness of 3,000 angstroms both exist. By these two insulator layers 4 and 5, insulation between the lower electrode 1 and the upper electrode 6 is secured outside the area where the MIM device 10 is formed.

Figure 4:
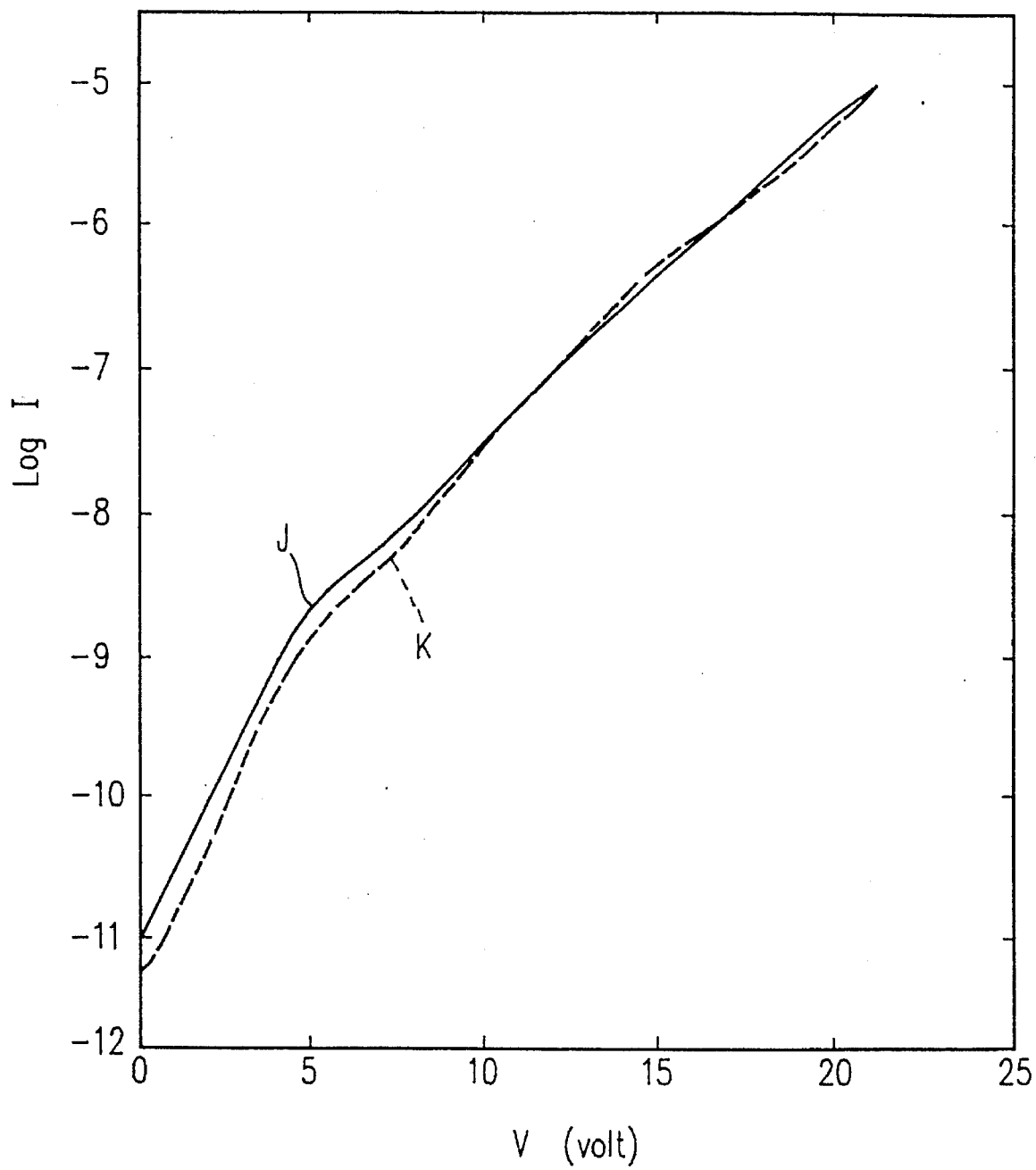
FIG. 4 is a graph illustrating the voltage vs. current characteristic of the MIM device of the LCD device in the example according to the present invention.

FIG. 4 is a graph illustrating the voltage vs. current characteristic of the MIM device 10. Line J represents the characteristic obtained when the current flows from the lower electrode 1 to the upper electrode 6, and line K represents the characteristic obtained when the current flows from the upper electrode 6 to the lower electrode 1. As is appreciated from FIG. 4, the voltage vs. current characteristic of the MIM device 10 is almost identical in whichever direction the current flows. In other words, the symmetry of the voltage vs. current characteristic is satisfactory.

In the LCD device 20 having such an MIM device 10 as a switching device, pixel defects caused by defective MIM devices are reduced, and the characteristics of the MIM device 10 are uniform in the entire display panel. As a result, uniform quality display is obtained all over the display panel.

In the above-described example, both ends of the upper electrodes 6 are diagonal on the side surface of the lower electrode 1. However, sufficient effect can be achieved if only one of the ends is diagonal.

FIGS. 5, 7, 9, 11 and 13 are plan views of bottom substrates of the LCD devices in various modifications according to the present invention. FIGS. 6, 8, 10, 12 and 14 are cross sectional views of the bottom substrates shown in FIGS. 8, 7, 9, 11 and 13, respectively.

Figure 5:
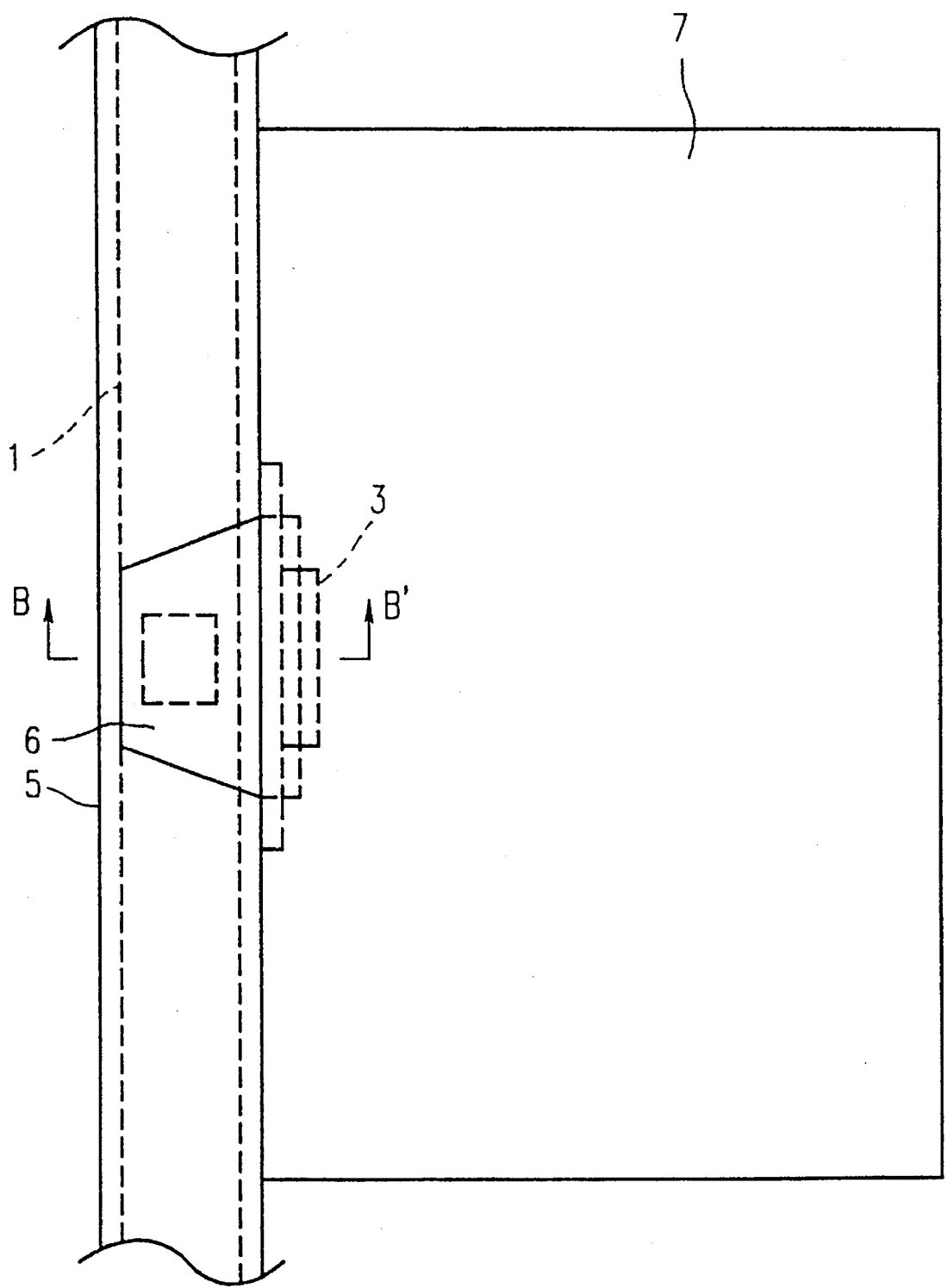
FIG. 5 is a plan view of a bottom substrate of an LCD device in a modification of the example according to the present invention.
Figure 6:
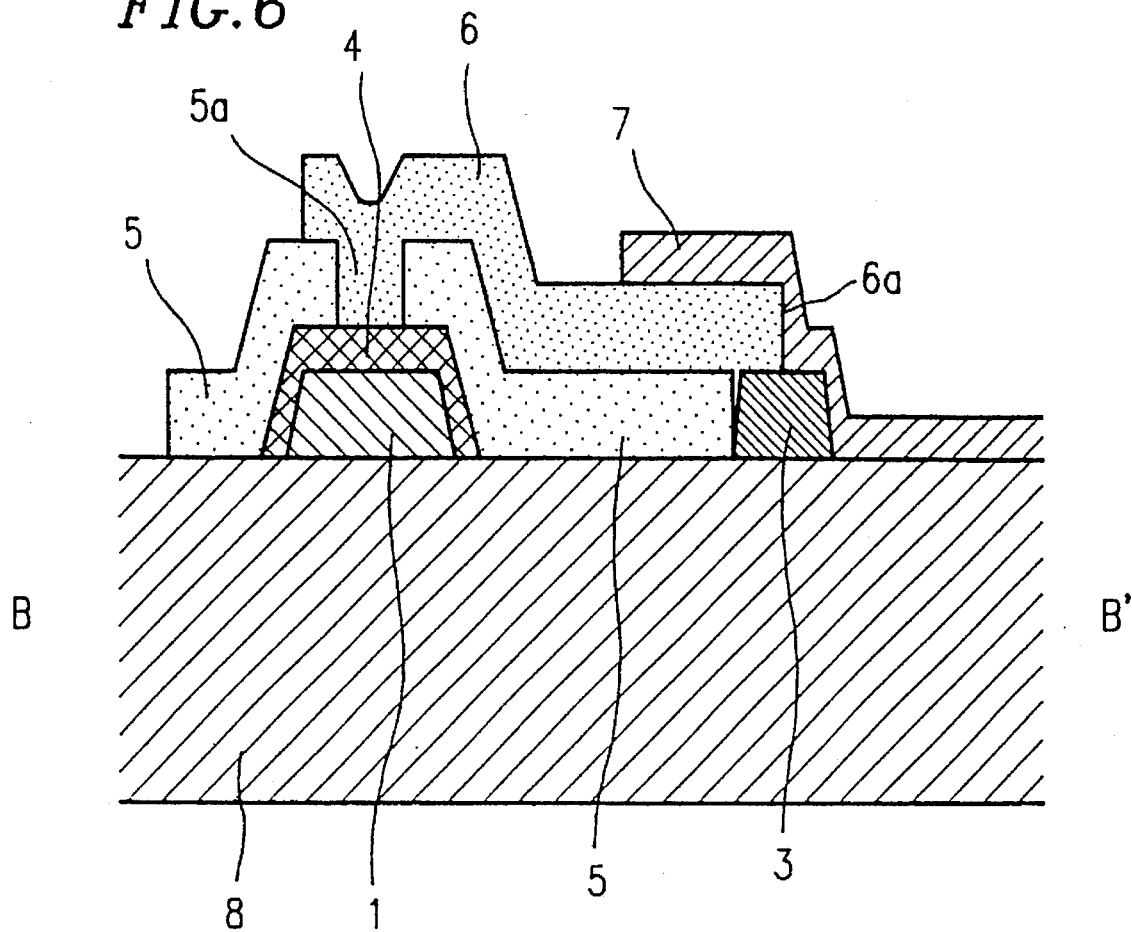
FIG. 6 is a cross sectional view of the bottom substrate shown in FIG. 5 taken along a line B–B' in FIG. 5.

In the example shown in FIGS. 1, 2A and 2B, the pixel electrode 7 entirely covers the upper electrode 6. However, the upper electrode 6 need not be entirely covered with the pixel electrode 7. For example, as is shown in FIGS. 5 and 6, the pixel electrode 7 may cover only a bottom part 6a of the trapezoidal upper electrode 6 but not an area of the upper electrode 6 located above the lower electrode 1.

Figure 7:
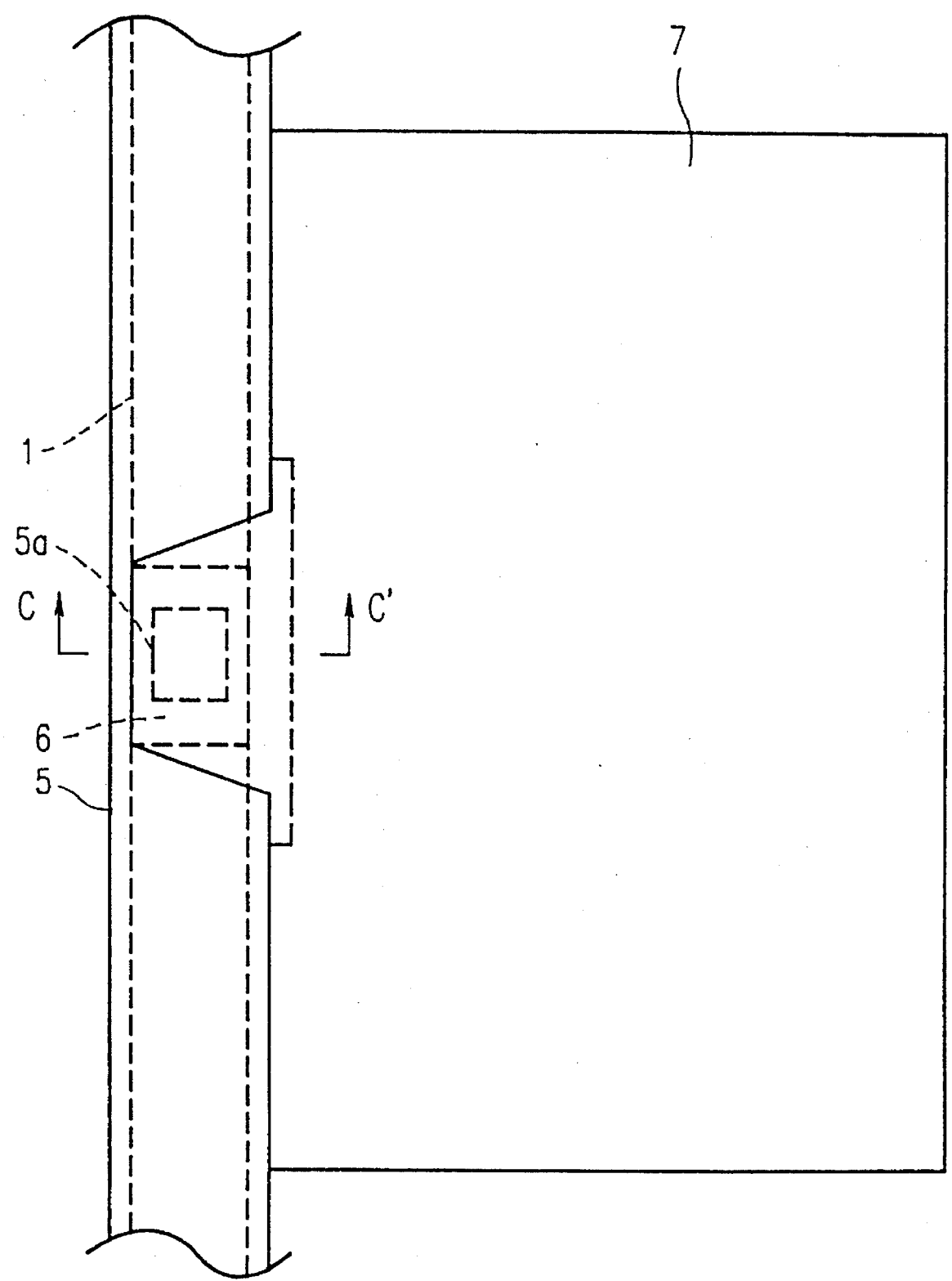
FIG. 7 is a plan view of a bottom substrate of an LCD device in another modification of the example according to the present invention.
Figure 8:
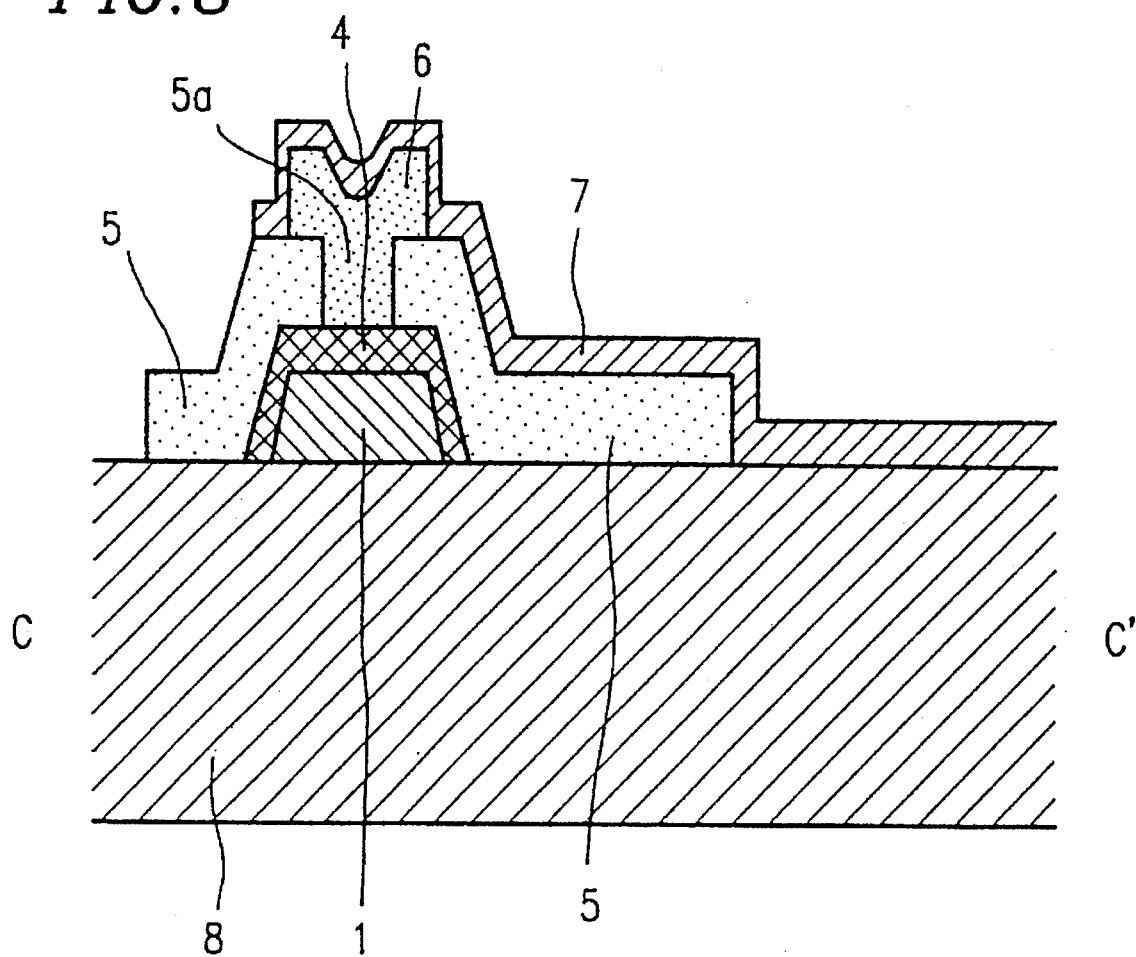
FIG. 8 is a cross sectional view of the bottom substrate shown in FIG. 7 taken along a line C–C' in FIG. 7.

As is shown in FIGS. 7 and 8, the upper electrode 6 may be located only on the top surface of the lower electrode 1, in which case, the upper electrode 6 is entirely covered with the pixel electrode 7. In this structure, the island 3 for preventing the upper electrode 6 and the pixel electrode 7 from peeling off from the transparent substrate 8 is eliminated.

Figure 9:
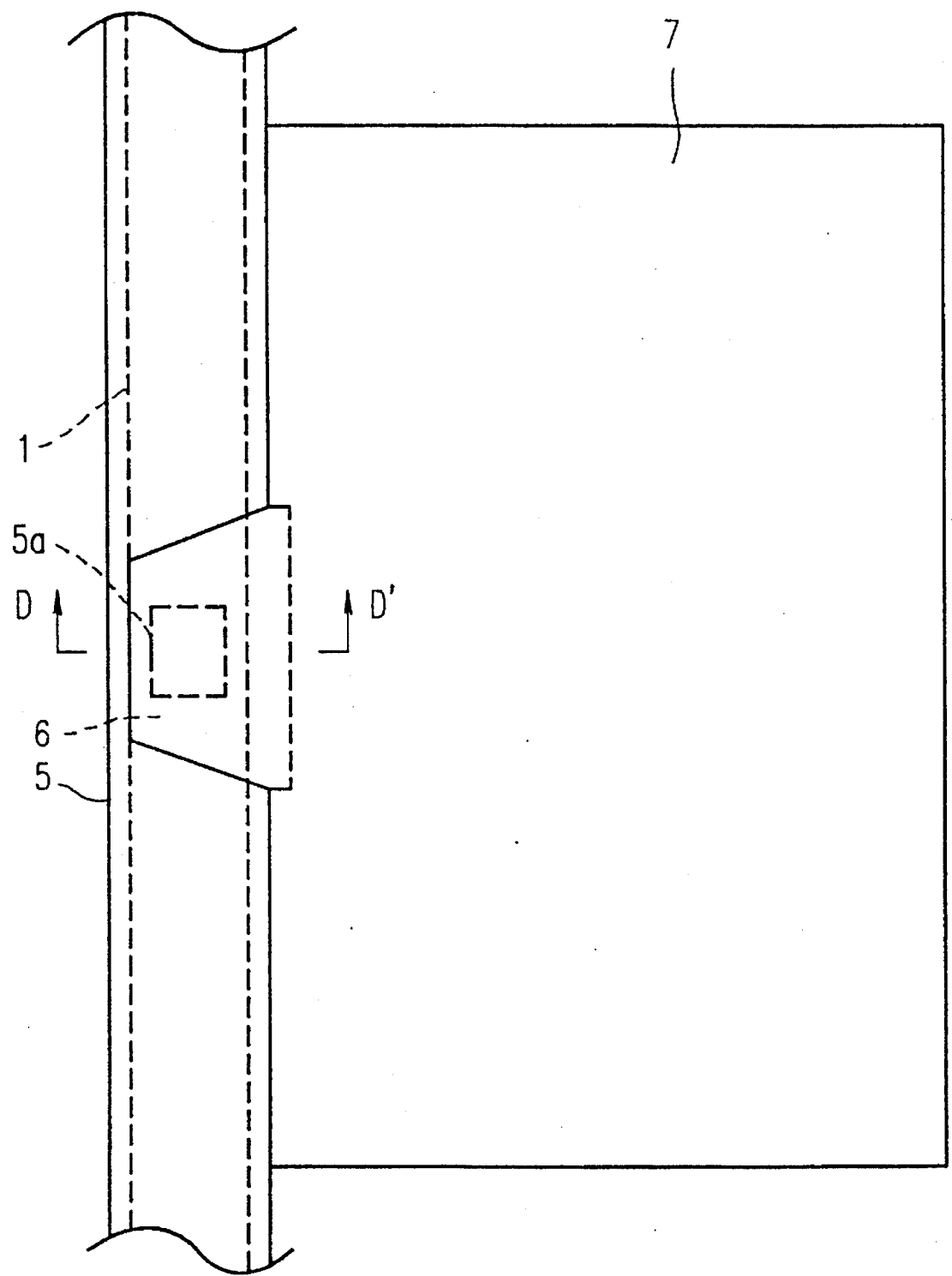
FIG. 9 is a plan view of a bottom substrate of an LCD device in still another modification of the example according to the present invention.
Figure 10:
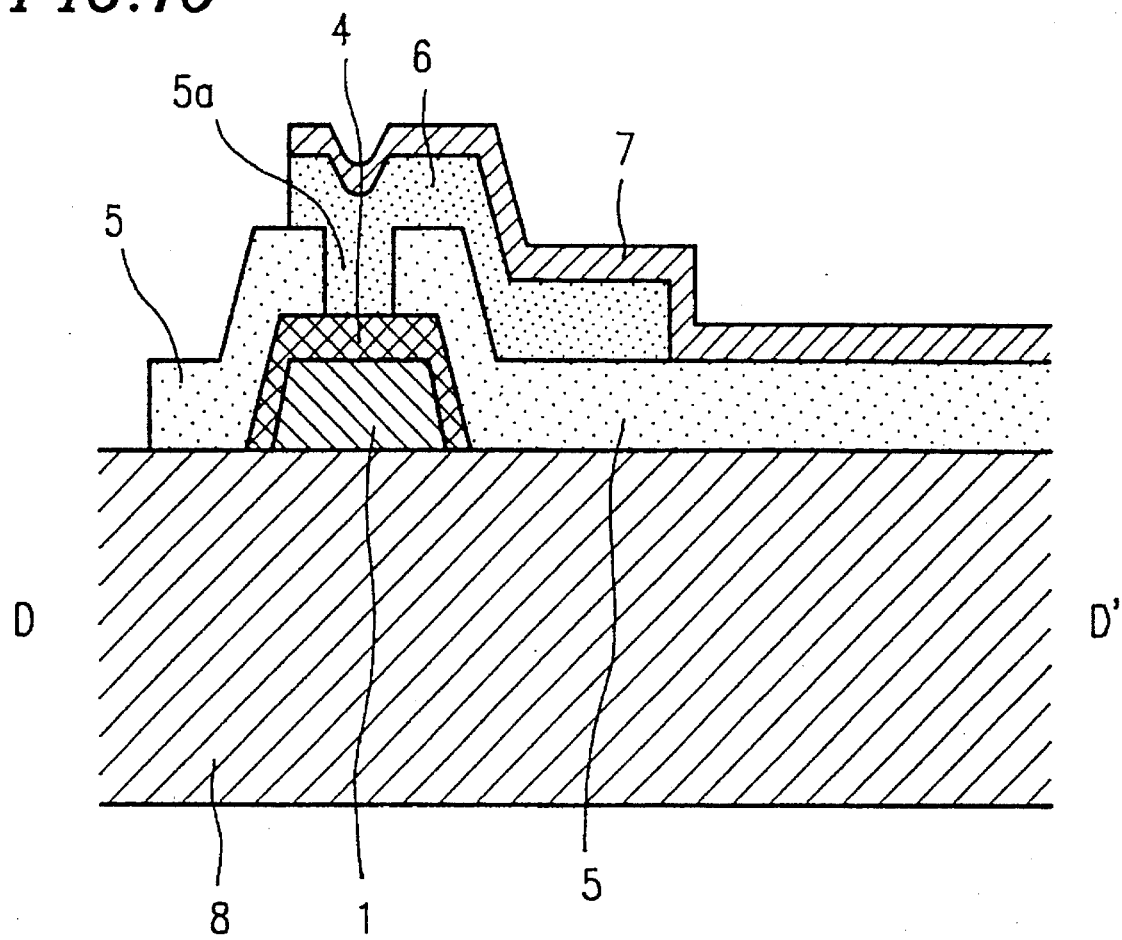
FIG. 10 is a cross sectional view of the bottom substrate shown in FIG. 9 taken along a line D–D' in FIG. 9.

As is shown in FIGS. 9 and 10, the insulator layer 5 may cover the entire surface of the bottom substrate except for the opening 5a instead of covering only the lower electrode 1 and the vicinity thereof. In this way, the insulator layer 5 can also be used as a base coat insulator layer. The bottom substrate shown in FIGS. 9 and 10 is produced in the following manner. A tantalum thin film is formed directly on the glass plate 8. By patterning the thin film, the signal wire 1 is formed, but the island 3 is not formed. The oxide film 4 is formed by anodizing a surface of the signal wire 1, and the insulator layer 5 is formed by depositing a thin film on substantially the entire surface of the resultant lamination and patterning the thin film to form the opening 5a. The upper electrode 5 and the pixel electrode 7 are formed sequentially thereon. By using the insulator layer 5 as a base coat insulator layer, the number of processes for producing the LCD device 20 can be reduced.

Figure 11:
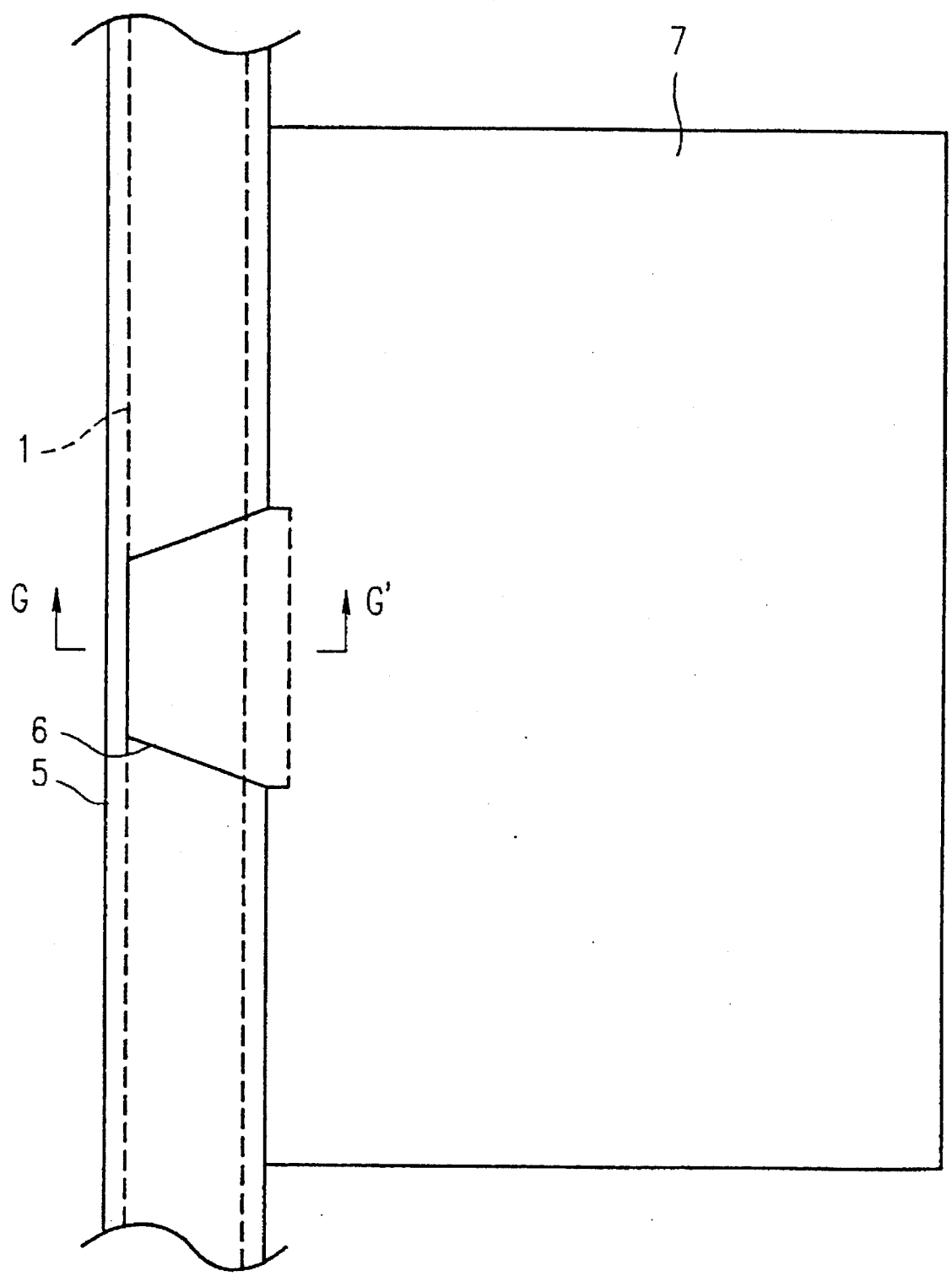
FIG. 11 is a plan view of a bottom substrate of an LCD device in still another modification of the example according to the present invention.
Figure 12:
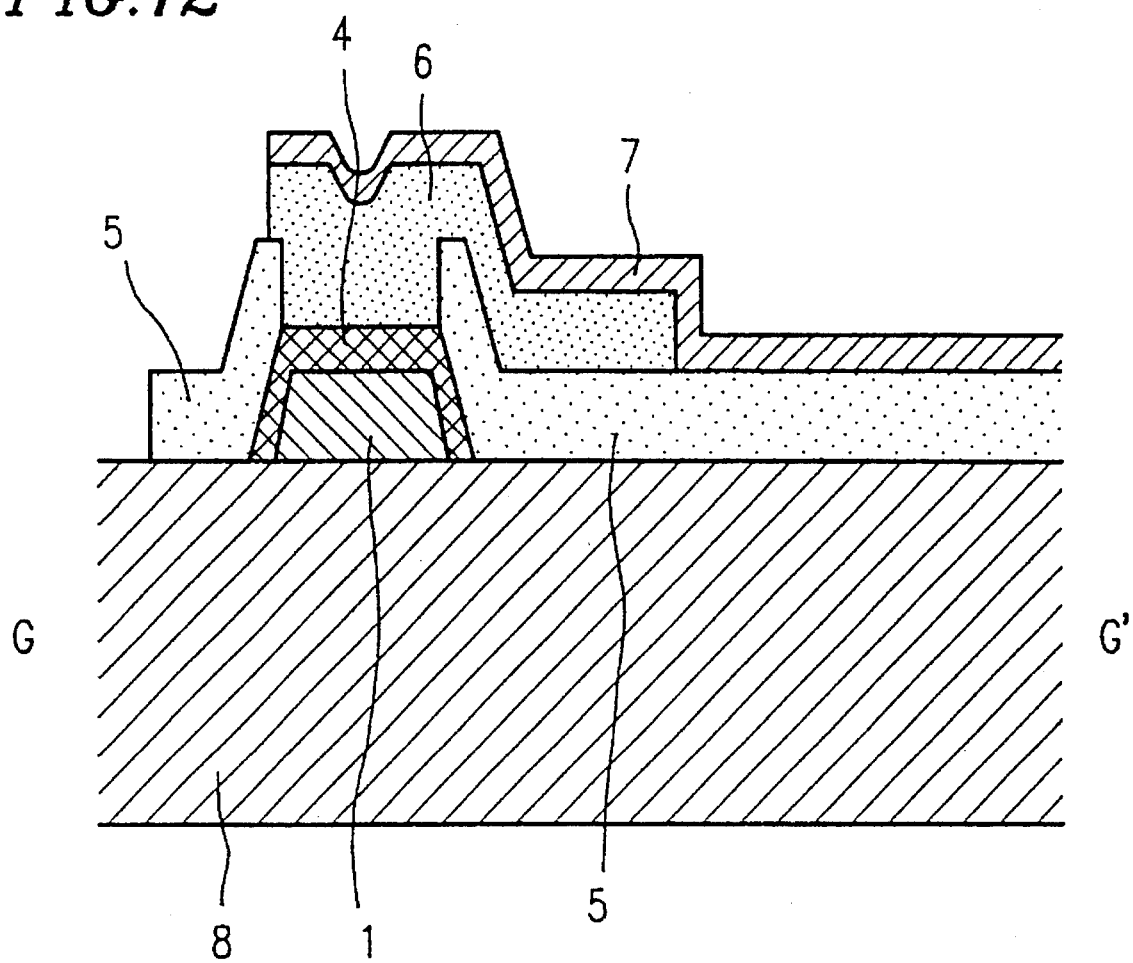
FIG. 12 is a cross sectional view of the bottom substrate shown in FIG. 11 taken along a line G–G' in FIG. 11.

As is shown in FIGS. 11 and 12, the insulator layer 5 may cover the entire surface of the lamination including the glass plate 8, the lower electrode 1, and the oxide film 4 except for a top surface of the signal wire 1. In this case, the size of the opening 5a is substantially equal to the size of the signal wire 1 in the width direction thereof (along a line G–G'). In the structure shown in FIGS. 11 and 12, the width of the opening 5a and the width of the signal wire 1 are both 20 μm.

Figure 13:
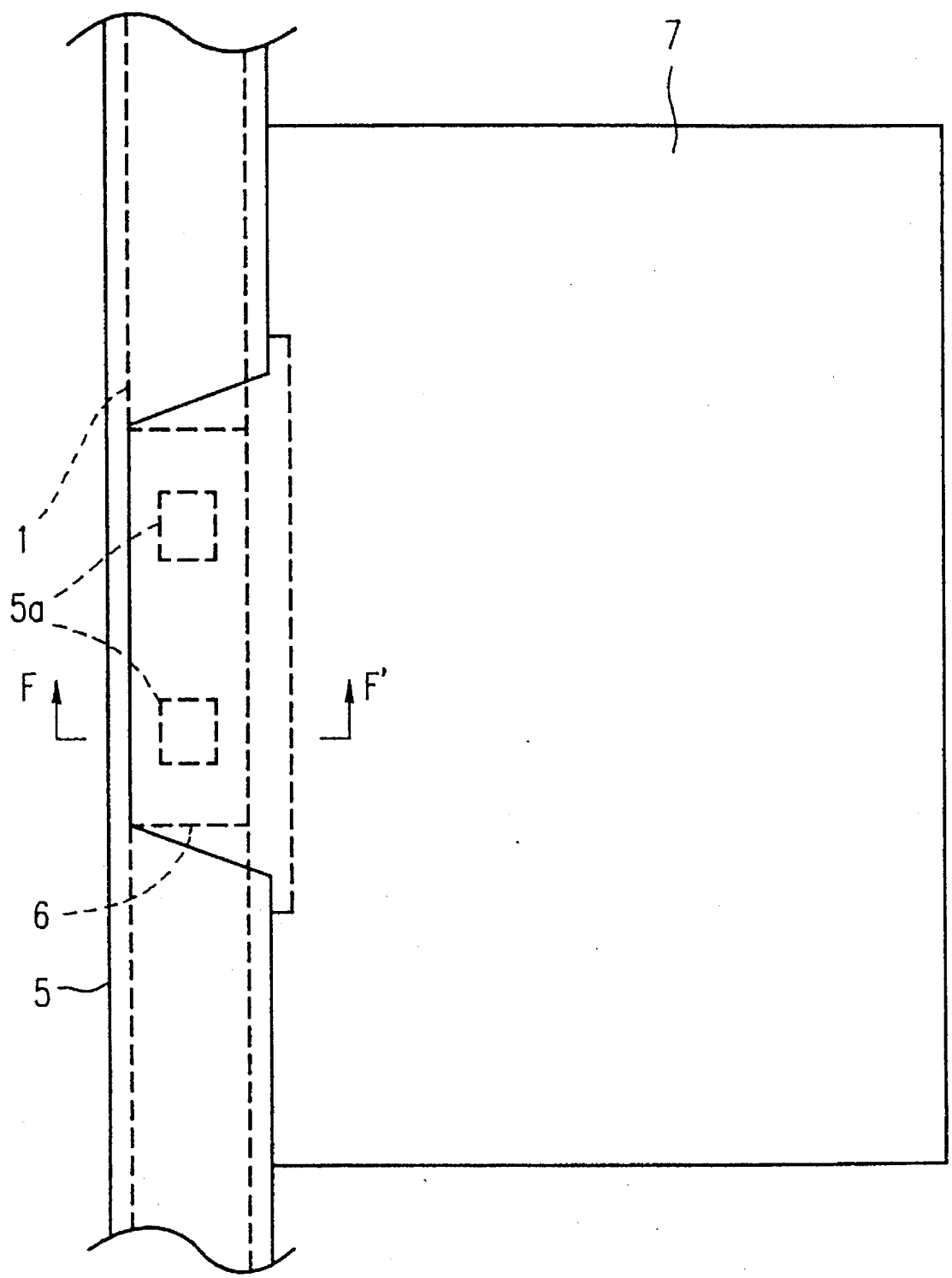
FIG. 13 is a plan view of a bottom substrate of an LCD device in still another modification of the example according to the present invention.
Figure 14:
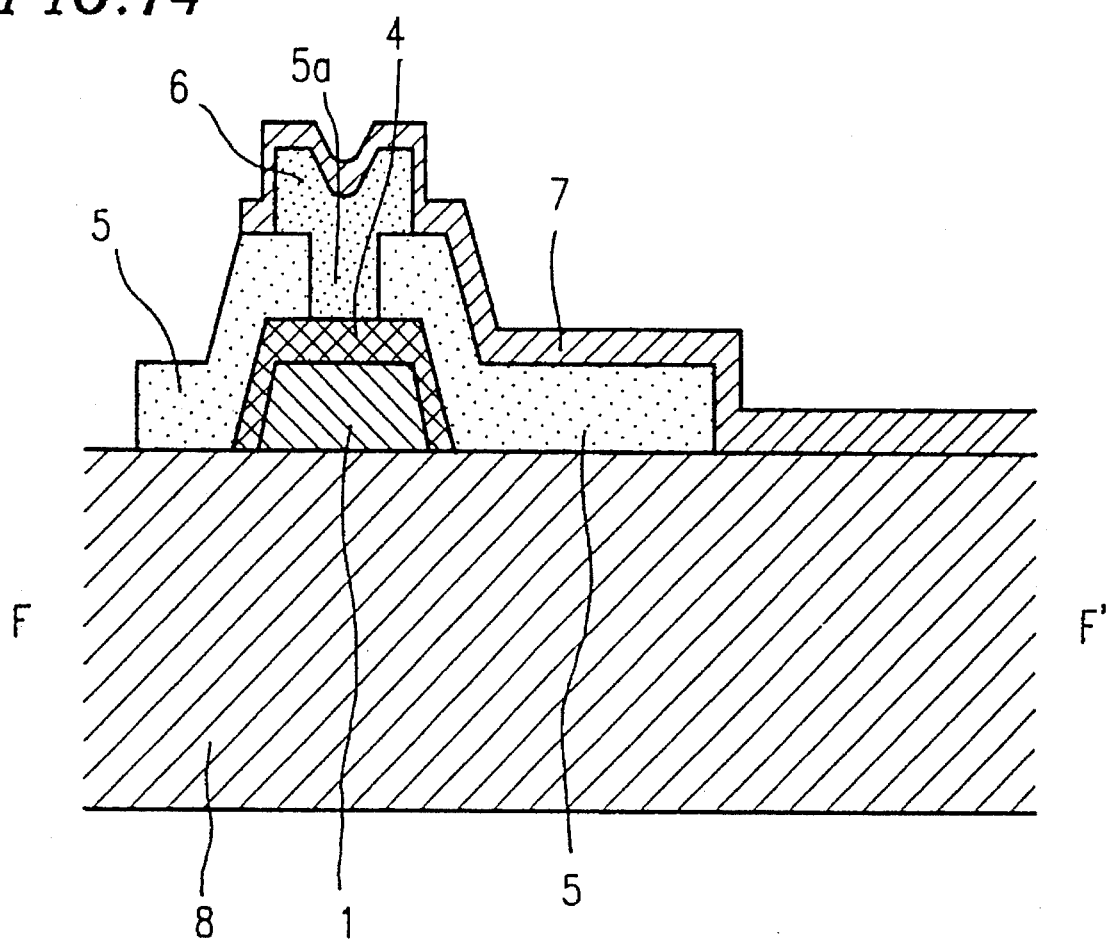
FIG. 14 is a cross sectional view of the bottom substrate shown in FIG. 13 taken along a line F–F' in FIG. 13.

As is shown in FIGS. 13 and 14, a plurality of openings 5a may be provided in the insulator layer 5 in an area corresponding to the top surface of the signal wire 1. In such a structure, a plurality of MIM devices are provided to drive one pixel. In this case, even if one of the MIM devices is defective, the pixel does not become defective. Thus, pixel defects caused by defective MIM devices can be reduced. The number of the openings 5a is not limited to two.

As is appreciated from the above description, according to the present invention, the ends of the upper electrode of the MIM device cross the side surface of the signal wire diagonally, instead of perpendicularly, with respect to the direction in which the signal wire extends. In other words, the angle between the direction in which the signal wire extends and each end of the upper electrode is decreased as is described above. As a result, the upper electrode is more difficult to be cut on the side surface than the case where the ends cross the side surface perpendicularly.

According to the present invention, the MIM device includes a part of the signal wire, a part of the first insulator layer, and a part of the upper electrode corresponding to the opening of the second insulator layer. Accordingly, the withstand voltage is not lowered on the side surface as it is in conventional MIM devices. This prevents breakdown of the MIM device and deterioration of the characteristics of the MIM device by static electrically generated in the production processes of the LCD device after formation of the MIM device. Accordingly. LCD devices each including a great number of such MIM devices on a large substrate are produced at a higher yield, and such LCD devices have satisfactory quality.

Since the lower electrode is covered with the second insulator layer, the lower electrode is not etched during the patterning process for forming the upper electrode. This allows the lower electrode and the upper electrode to be formed of the same material.

In the case where the second insulator layer is also used as the base coat film, the production processes can be simplified. In the case where the second insulator layer is formed only on the signal wire and the vicinity thereof, reduction in the transmissivity of the pixel area by the second insulator layer can be prevented.

In the case where a plurality of openings are formed in the second insulator layer in an area corresponding to the top surface of the lower electrode, a redundancy structure in which a plurality of MIM devices are provided for one pixel is realized.

According to the present invention, the MIM device is formed in an area corresponding to the opening of the second insulator layer. An active matrix LCD device including such an MIM device does not require provision of a switching device or a metal wire in an active area. Accordingly, reduction in the aperture ratio can be prevented.

In the case where the upper electrode and the pixel electrode are in contact with each other through the island, the contact can be more secure and more satisfactory. The island, which is formed of the same material as the signal wire, is produced without increasing the number of production processes.

In the case where the connection between the upper electrode and the pixel electrode is realized only above the lower electrode, the reduction in the transmissivity of the pixel area caused by the upper electrode is avoided.

Various other modifications wall be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A liquid crystal display device, comprising:

a first substrate including a plurality of pixel electrodes arranged in a matrix, a plurality of signal wires formed of metal for supplying the plurality of pixel electrodes with an electric charge, and a plurality of two-terminal nonlinear devices for switching connection between the plurality of pixel electrodes and the plurality of signal wires into one of a conductive state and a non-conductive state;

a second substrate located opposite to the first substrate and including a plurality of scanning electrodes arranged parallel to each other and crossing the plurality of signal wires; and a liquid crystal layer sandwiched between the first substrate and the second substrate, wherein the plurality of two-terminal nonlinear devices each include:

a lower electrode which is a part of the corresponding signal wire;

a first insulator layer located on the lower electrode provided as a result of anodic oxidation of a part of the lower electrode and having a thickness of no greater than 1,000 angstroms;

a second insulator layer covering the first insulator layer and having at least one opening, the second insulator layer being formed of a different material from the first insulator layer; and an upper electrode located on the second insulator layer and connected to the first insulator layer through the opening, and wherein the plurality of signal wires each have a top surface and a pair of side surfaces, and the upper electrode has an end extending diagonally with respect to a direction in which the corresponding signal wire extends on at least one of the side surfaces of the corresponding signal wire.

2. A liquid crystal display device according to claim 1, wherein the second insulator layer has a thickness exceeding 1,000 angstroms.

3. A liquid crystal display device according to claim 1, wherein one opening is provided for each pixel electrode at a top surface of the corresponding signal wire and has a width which is substantially equal to the width of the top surface.

4. A liquid crystal display device according to claim 1, wherein the first substrate includes a glass plate containing alkali metal, the plurality of signal wires are located directly on the glass plate, and the plurality of pixel electrodes are located on the second insulator layer used as a base coat insulator layer.

5. A liquid crystal display device according to claim 1, further comprising an island located in the vicinity of each of the plurality of two-terminal nonlinear devices, the island being formed of an identical material with the plurality of signal wires, and each of the upper electrodes and each of the pixel electrodes respectively connected to the two-terminal nonlinear devices are partially superposed on the corresponding island.

6. A liquid crystal display device according to claim 1, wherein the plurality of pixel electrodes respectively connected to the two-terminal nonlinear devices are each superposed on an area of the corresponding upper electrode which is above the corresponding lower electrode.

7. An active matrix substrate, comprising:

a pixel electrode;

a signal wire formed of metal for supplying the pixel electrode with an electric charge, the signal wire including a top surface and a pair of side surfaces; and a two-terminal nonlinear device for electrically connecting the signal wire and the pixel electrode, wherein the two-terminal nonlinear device includes:

a lower electrode which is a part of the signal wire;

a first insulator layer located on the lower electrode where the first insulator layer is an anodic oxide layer;

a second insulator layer located on the first insulator layer and having an opening; and an upper electrode located on the second insulator layer and connected with the first insulator layer through the opening, wherein the upper electrode has an end extending diagonally with respect to a direction in which the signal wire extends on at least one of the side surfaces of the signal wire.

* * * * *